United States Patent [19]

Ten Eyck et al.

[11] Patent Number: 4,526,826

[45] Date of Patent: Jul. 2, 1985

[54] FOAM SEMICONDUCTOR DOPANT CARRIERS

[75] Inventors: Monika O. Ten Eyck, Lewiston; Martin R. Kasprzyk, Ransomville, both of N.Y.; Richard E. Tressler, Julian, Pa.

[73] Assignee: Kennecott Corporation, Cleveland, Ohio

[21] Appl. No.: 502,261

[22] Filed: Jun. 8, 1983

[51] Int. Cl.$^3$ ................................................ B32B 9/00
[52] U.S. Cl. ................................ 428/131; 427/85; 427/227; 427/244; 428/311.5; 428/317.9; 428/688; 428/697; 428/699
[58] Field of Search ............... 427/85, 227, 244; 428/131, 304.4, 311.1, 311.5, 312.6, 312.8, 319.1, 317.9, 688, 697, 699; 521/52, 55

[56] References Cited

U.S. PATENT DOCUMENTS

| | | | |
|---|---|---|---|
| 3,124,542 | 3/1964 | Kohn | 428/317.9 |
| 3,353,994 | 11/1967 | Welsh et al. | 521/55 |
| 3,511,689 | 5/1970 | Winklar | 428/311.5 |
| 3,666,526 | 5/1972 | Ettinger et al. | 428/312.2 |
| 4,004,933 | 1/1977 | Ravault | 264/44 |
| 4,171,410 | 10/1979 | Fröb | 428/317.9 |
| 4,258,099 | 3/1981 | Narumiya | 428/304.4 |
| 4,433,008 | 2/1984 | Schnable et al. | 427/85 |

FOREIGN PATENT DOCUMENTS

| | | | |
|---|---|---|---|
| 0067627 | 6/1982 | European Pat. Off. | |
| 1242864 | 8/1971 | United Kingdom | 428/316.6 |

*Primary Examiner*—William J. Van Balen
*Attorney, Agent, or Firm*—W. J. Crosetta; D. M. Ronyak

[57] ABSTRACT

New porous semiconductor dopant carriers are disclosed together with a method for the diffusion doping of semiconductors by the vapor phase transport of an n or p type dopant, such as phosphorus, arsenic, antimony, boron gallium, aluminum, zinc, silicon, tellurium, tin and cadmium to the semiconductor host substrate; wherein the dopant carrier is comprised of a rigid, multiphase dimensionally stable refractory foam, formed through the impregnation, and subsequent thermal destruction of an open-celled organic polymer foam.

2 Claims, No Drawings

FOAM SEMICONDUCTOR DOPANT CARRIERS

FIELD OF THE INVENTION

This invention relates to novel semiconductor dopant carriers comprised of refractory bonded, inert, inorganic materials formed to an open, foamed, cellular structure by a process which comprises impregnating an open, foamed organic material with a fluid slurry containing a refractory material and thereafter heating said impregnated material to a temperature and for a time sufficient to substantially decompose the organic material and bond said refractory material into a coherent structure substantially conforming to the original foamed organic material. The invention includes methods of preparing diffusion sources and diffusion sources containing said carriers, to methods for diffusion doping semiconductors and to semiconductors formed utilizing said novel carrier containing diffusion sources.

BACKGROUND OF THE INVENTION

Semiconductor elements have multiple applications and utility in the electronics industry and are used in rectifiers, transistors, photodiodes, solar batteries, radiation detectors, charged particle detectors, integrated circuits and various other applications. They have been known in the industry for many years and the term semiconductor element is generally accepted throughout the industry and intended in this application to generically include semiconductor devices or parts thereof formed of host substrates comprising elements, alloys and intermetallic compounds of silicon, germanium, silicon/germanium, gallium arsenide, indium phosphide and the like. Such semiconductor elements can be of any convenient or suitable shape or form but are typically commercially used in the form of circular, rectangular or triangular wafers or disks.

In order to achieve the various electrical rectification characteristics so important to their multiple applications and utilities, semiconductor elements typically have an active impurity incorporated within the host substrate, during manufacture or later by diffusion, which impurity can affect the electrical rectification characteristics of the semiconductor element. These active impurities are usually classified as donor impurities or acceptor impurities; the donor impurities including phosphorus, arsenic, antimony, silicon, tellurium, tin and the like; and the acceptor impurities including boron, gallium, aluminum, zinc, cadmium and the like.

The semiconductor element may have a region thereof containng an excess of donor impurities thus yielding an excess of free electrons. Such region is termed an impurity doped n-type region. Similarly, the semiconductor element may have a region thereof containing an excess of acceptor impurities, which results in a deficit of electrons, such region being termed an impurity doped p-type region. The boundary between such p-type and n-type regions is termed the n-p or p-n junction. In many applications the uniformity of the impurity distribution within the p or n-type regions, as well as the sharpness of the p-n or n-p junction, is critical to the efficiency of the semiconductor element.

Multiple means have been proposed for incorporating various active impurities in the semiconductor element. Typically, the active impurity may be intimately incorporated during preparation of the host substrate or may be incorporated by deposition on the host substrate during manufacture.

DESCRIPTION OF THE PRIOR ART

The deposition of active impurities at the surface of the semiconductor host substrate during manufacture typically comprises the high temperature diffusion of vaporized dopant atoms into the body of the host substrate. Typically the diffusion of the doping substance into the host substrate is achieved by heating a predetermined quantity of dopant, together with the host substrate, in a closed receptacle in such manner that dopant atoms will permeate the semiconductor body from all or selected sides. One method, involving deposition of dopants on a limited surface of a semiconductor element, is described in U.S. Pat. No. 3,287,187 wherein an oxide of the host substrate material is deposited on the host substrate followed by diffusion of the doping substance into the substrate surface area by heating the host substrate.

U.S. Pat. No. 3,923,563 depicts a typical method of deposition and diffusion wherein porous, rigid dimensionally stable wafers are formed by compacting and sintering refractory oxide powders. The thus formed wafers are then impregnated with aluminum metaphosphate, arsenic oxide or antimony oxide by treatment with solutions thereof in suitable organic or aqueous solvents. These wafers function as the source of dopant vapors and are positioned in a suitable furnace in the vicinity of the host substrate. The dopant wafer and host substrate are heated to temperatures between about 850° C. to about 1250° C. wherein the dopant wafer liberates phosphorus, arsenic or antimony oxide vapors which pass through the furnace and contact the host substrate. The vapors appear to react with the hot silicon surface and the elemental phosphorus, arsenic and/or antimony diffuse into the host substrate with continued heating to create the semiconductor element.

U.S. Pat. No. 3,920,882 discloses a solid dopant source comprising a porous, inert, rigid, dimensionally stable, refractory support impregnated with a dopant component. The porous supports are formed by compacting and sintering refractory oxide powders such as stabilized zirconia powder, alumina powders, silica powders, thoria and the like; they are compacted, sintered and thereafter impregnated with a solution of the dopant component.

U.S. Pat. No. 3,090,094 and U.S. Pat. No. 3,097,930 describe the preparation of porous ceramic articles, such as ceramic foams by the method of impregnating open-celled organic polymers and thereafter heating to form a refractory foamed material. U.S. patent application Ser. No. 502,285 filed on even date herewith, describes the preparation of refractory composite foams formed by the impregnation and infiltration of organic polymers.

OBJECTS OF THE INVENTION

One object of the invention is to provide novel solid foam dopant carriers comprising a refractory, open celled foam structure with a plurality of interconnecting pores.

Another object of the invention is to provide novel solid dopant sources comprising a foam refractory cellular carrier containing a dopant.

A further object is to provide methods for the preparation of foam refractory dopant sources.

A still further object is to provide a method for the vapor deposition doping of semiconductor host substrates by a foam refractory dopant source and to semiconductor elements so formed.

These and other objects will be apparent from the following description of the invention.

DESCRIPTION OF THE INVENTION

It has been discovered that high porosity solid dopant carriers can be provided, having superior three dimensional connectivity cellular configurations, which are capable of liberating active impurities contained thereon at elevated temperatures and which are so dimensionally stable as to have substantially no deformation or slump while maintaining thermal shock resistance. We believe the superior cellular configuration allows the production of lightweight dopant carriers which offer greater efficiencies in impregnating the carrier with a dopant and which have a greater usable surface area for contacting the dopant transport medium (e.g. gaseous or fluid medium between carrier and substance to be doped) therefore allowing higher dopant loading without impeding the flow of liberated dopant impurities. We believe the immediate commercial benefit is that dopant carriers, made in the cellular configuration of the invention, can be of superior efficiency to prior art carriers, thus can be made smaller, and/or thinner than the prior art allowing greater loading of semiconductor host substrates for processing and/or less frequent changing of dopant sources.

The open celled dopant carriers of the invention are achieved by heat bonding refractory materials on a decomposable cellular substrate. The principal steps of the process for preparing the carriers of the invention involves the impregnation of an appropriate foam organic polymer substrate, having an appropriate density and cell size, with a desirable refractory carrier material to form an adherent coating of carrier material thereon. The thus impregnated foam material is then heat bonded by subjecting to high temperature heating to sinter, fuse, melt infiltrate or otherwise fix the carrier material in the cellular configuration of the foam material and decompose the organic substrate. Refractory materials thus formed, take the configuration of the foam substrate, while attaining the rigidity and dimensional stability of the refractory product.

In accord with the instant invention, any suitable organic polymer foam material can be utilized providing it has sufficient physical properties to withstand, as desired, the process treatments prior to high temperature heating. Typical organic polymers which can be utilized in this process include cellulosics, polystyrenes, polyethylenes polypropylenes, polyvinyl chlorides, latexes, acrylics, polyurethane foamed materials, mixtures thereof and the like. The foam may have varying degrees of rigidity or flexibility at varying temperatures. Impregnation, and any slurry expulsion, drying or other steps taken prior to high temperature heating should be instituted at controlled temperature ranges which insure that breakage, dissociation or degradation of the foam will not occur during early processing steps. A foam which has adequate flexibility at temperature ranges from about 10° C. to about 100° C. is preferred.

The organic foam can be formed in any convenient size and shape, but generally it is formed in substantially the same size and shape as the final dopant carrier which is sought to be produced. As dopant carriers used for the vapor deposition of dopants on semiconductor elements are usually formed in the approximate size and shape of the semiconductor element to be doped, the shape of the organic foam material usually approximates the shape of the semiconductor elements. It should be recognized that before and/or during subsequent processing, the foam will be variably compressed, dried, swelled, etc., depending upon the various choice of processing alternatives hereinafter disclosed and consideration should be given thereto when sizing of the foam body for a particular purpose. One advantage of the instant invention is that the organic foam can be formed into rods, billets, etc., which thereafter can be cut into wafers, disks, etc., rather than procesing each wafer, disc, etc., individually.

Typically, organic foam materials are available in a wide range of cell sizes form tightly packed small cellular configuration to large cellular configurations. Similarly, the cell density can vary greatly and typically are commercially available in multiple density gradients. We have found that for the production of dopant carriers to be utilized in the vapor phase deposition of dopants on a semiconductor substrate, that cell sizes in the range of about 2,500 microns to about 50 microns having about 10 to about 500 pores per linear inch, have produced preferable results. In some instances, it has been found appropriate to compress the foam material to achieve more desirable porosity.

The foam may be treated with various additives prior to, during, or after the impregnation, or any slurry expulsion, drying or coating steps. Typically, such additives may effect the uniform distribution of the particulate refractory material or enhance adherency to the foam material, by swelling or solubilizing portions of the foamed structure to create better adhesion, or allow improved infiltration of the second refractory material. In many instances the polymer may be pre-swelled prior to treatment with the fluid slurry to increase the rate and extend of imbibition. Water itself is a suitable swelling agent for cellulosic type polymers, and in other instances aromatic alcohols, ketones or similar suitable solvents may be appropriate.

During the impregnation step of the process, particulate refractory material is deposited on the cellular organic foam, adhering to the structural elements thereof, in such manner as to closely approximate the physical configuration of the foam. Though the particulate refractory material can be applied in dry powdered form it is preferred to apply the material in a fluid slurry and thereafter at least partially squeeze and/or dry the treated organic foam prior to high temperature heating. Upon drying, the organic foam may appear unchanged except for color and its fragile rigidity, but upon closer inspection a thin coat of paticulate refractory material can be seen deposited upon the exposed surfaces of the cellular foam.

Typically, the refractory material containing fluid slurry utilized for impregnation is an aqueous suspension containing from about 10 to about 90 parts by weight refractory material. Generally, the weight ratio of the impregnated refractory material to the dry organic foam is from about 1:1 to about 20:1. Other compounds may be present such as gel formers, thickening agents or binding agents which may enhance the uniformity of distribution of the material on the foamed polymer structure during impregnation, or effect its adherency thereto. Other additives may also be present such as agents which affect or in some way control drying, or agents which may have an effect upon subsequent high temperature heating of the refractory materials.

Impregnation of the foamed polymer substance can be effected by several methods. Generally, the amount of refractory deposited on the cellular structure of the polymer foam is in direct proportion to its concentration in any solution/suspension that is used for treatment. Typically, the easiest method is to immerse the polymer foam substance in a concentrated suspension of the material to be deposited. Other means of impregnation, however, include spraying means, roll coating means, or similar methods where the polymer structure is not deleteriously harmed during the process.

A particularly effective means of impregnating the organic foam is by immersion or spraying the organic foam with a fluid suspension of the refractory to be deposited thereon. In such systems it is preferred to utilize the refractory in aqueous suspension and various additives may be present which may affect the deposition process.

To improve impregnation of the foam with the fluid suspension, the impregnated foam material is typically treated to maximize the impregnation and deposition of the refractory material while expelling excess fluid suspension therefrom. Generally, this removal of fluid suspension is closely controlled and uniformly applied throughout the foam workpiece to obtain a uniform refractory article. A wide variety of methods are known in the removal of excess fluid suspension from the impregnated foam, including blowing out with compressed air, centrifuging and squeezing including passage between rollers or the like. Generally it has been found that hand squeezing is adequate, however, the passing through varying roller pressures can provide a more uniform product.

After impregnation, the treated organic material may be dried to remove excess fluid. Though drying is not a necessary step before firing the refractory, it is typically done to avoid complications from excessive moisture. Drying can be achieved by any convenient means such as oven, blowers, air drying, etc. Appropriate safety precautions should, however, be taken when the fluid portion of the slurry is an organic compound or contains organic compounds or the like. Generally drying temperatures should be kept low enough so that the organic foam is not substantially deformed or otherwise detrimentally harmed thereby. Generally drying temperatures between from about 10° C. to about 120° C. are preferred for water based suspensions. It should be noted, however, that higher temperatures might in certain instances be desirable for instance to create a desirable deformation of the organic foam to achieve a particular configuration or affect the amount of fluid removed during the drying process can vary widely. Generally, it is preferred to dry to a fluid content less than about 25% by weight of the impregnated material.

After the impregnated organic foam has had the excess slurry removed and, if desired, dried, the refractory material is fired to heat bond the refractory particles by sintering, fusion or otherwise, into a refractory structure. Typically, temperatures in excess of about 600° C. are necessary to obtain an appropriate product and it is preferred to utilize a refractory material requiring temperatures in excess of 1200° C. to obtain fusing. The higher temperature materials are preferred in that the product obtained therefrom is less likely to emit impurities or structurally deform during its subsequent use as a dopant carrier in the normal deposition doping temperature ranges of from about 500° C. to about 1400° C. Varying pressures may be utilized in any step of the process, but generally it is preferred to operate at atmospheric pressure or less.

In some instances it is preferred to apply an infiltrating refractory in accord with the process of copending application U.S. Ser. No. 502,285 to the impregnated organic foam material. The infiltrating refractory must have a lower melting point than the impregnating refractory such that at the firing temperature it will melt to infiltrate the impregnating refractory without melting the latter.

Application of the infiltrating refractory (infiltrant) to the dried, impregnated foam can be by a fluid slurry system but generally it is preferred to apply a coarse, dry particulate coating of the infiltrating refractory to the impregnated foam. Typically it is sufficient to coat the surface of the foam with the infiltrant. Coarser paticulate material, having a particle size in excess of about 40 microns, is preferred when utilizing easily oxidizable infiltrating material as it appears to inhibit the influence of an undesirable oxidation phase during the infiltration process. Generally, the weight ratio of infiltrating refractory to the dried refractory impregnated foam is from about 0.05:1 to about 3:1. The thus infiltrant coated, impregnated foam body is heated to a temperature sufficient to melt the infiltrating refractory but les than that amount needed to melt the impregnated refractory. Upon heating the organic polymer decomposes, the infiltrating refractory melts, and it is believed that, through its wetting action on the impregnated refractory, the melted infiltrating refractory flows into the pores vacated by the decomposed polymer, and, when solidified, forms a matrix comprising a continuous composite with the impregnated phase.

The refractory materials utilized for impregnation and infiltration can be selected from a host of materials, it being generally preferred that the impregnation material have a melting point which exceeds about 1400° C. and the infiltration material a melting point which exceeds about 1200° C. and is below about 2300° C. The impregnating refractory material selected must have a melting point which is higher than that of the selected infiltrating material. Because of the possibility of undesirably depositing contaminants in the vapor deposition process, refractory oxides are preferably avoided as materials for such utility.

In addition, the melted (liquid) infiltrating refractory material should have the ability to wet the impregnating refratory material (solid) to a contact angle of less than about 45°. The contact angle is the angle between the solid surface of the impregnating material and the tangent to the liquid surface of the melted infiltrating material at the contact point of the two surfaces. In addition to the ability to wet, there should be resistance between the two materials being utilized to solubility of one into the other.

In the infiltrating process, heat is applied to the refractory impregnated, refractory infiltrant coated, organic foam to a temperature and time sufficient to decompose the organic foam and melt the infiltrating refractory material but less than that which will melt the impregnating refractory. The resulting rigid composite structure has substantially the same physical configuration as the foam organic polymer, but is comprised of a composite of impregnated and infiltrated refractory materials. Typical refractory materials, operable as impregnating materials in accord with the instant invention, include pure elements such as tungsten, molybdenum, niobium, chromium, zirconium, vanadium, titanium, boron, carbon, and the like; binary metal alloys such as tungsten/tantalum, tungsten/niobium, tungsten/molybdenum, tungsten/chromium, molybdenum/chromium, molybdenum/titanium, molybdenum/zirconium, and the like; borides such as $AlB_{12}$, $Ti_2B$, $TiB_2$, $ZrB_2$, $HfB_2$, $Nb_3B_2$, $NbB$, $Nb_3B_4$, $NbB_2$, $Ta_2B$, $TaB$, $TaB_4$, $TaB_2$, $Cr_2B$, $Cr_5B_3$, $CrB$, $Cr_3B_4$, $CrB_2$, $CrB_4$, $Mo_2B$, $Mo_3B_2$, $MoB$, $MoB_2$, $MoB_5$, $MoB_{12}$, $W_2B$, $WB$, $W_2B_5$, $WB_{12}$, $Mn_4B$, $Mn_2B$, $MnB$, $Mn_3B_4$, $MnB_2$, $MnB_4$, $Ni_4B_3$, $NiB$ and the like; carbides such as $NbC$, $Nb_2C$, $TiC$, $ZnC$, $HfC$, $V_2C$, $VC$, $Ta_2C$, $TaC$, $Cr_{23}C_6$, $Cr_7C_3$, $Cr_3C_2$, $Mo_2C$, $MoC$, $W_2C$, $WC$, $Fe_3C$, $B_4C$, $B_4C$, $B_{13}C_2$, $SiC$, and the like; nitrides such as $TiN$, $ZiN$, $HfN$, $VN$, $NbN$, $TaN$, $AlN$, $BN$ and the like; phosphides such as $NbP$, $Ti_3P$, $Ti_2P$, $Cr_3P$, $BP$, $CoP_2$, and the like; silicides such as $Ti_5Si_3$, $Ti_5Si_4$, $TiSi$, $TiSi_2$, $Zr_4Si$, $Zr_2Si$, $Zr_5Si_3$, $Zr_4Si_3$, $Zr_6Si_5$, $ZrSi$, $ZrSi_2$, $Hf_2Si$, $Hf_5Si_3$, $Hf_3Si_3$, $HfSi$, $HfSi_2$, $V_3Si$, $V_5Si_3$, $V_5Si_4$, $VSi_2$, $Nb_4Si$, $Nb_5Si_3$, $NbSi_2$, $Ta_9Si_2$, $Ta_2Si_3$, $Ta_5Si$, $TaSi_2$, and the like; ternary transition metals, systems containing cabon, boron, silicon, nitrogen or combinations thereof such as Ti-Zr-C, Ti-Hf-C, Ti-V-C, Ti-Nb-C, Ti-Ta-C, Ti-Mo-B, Zr-Hf-B, Zr-Ta-B, Hf-Ta-B, V-Nb-B, Nb-Ta-Si, Nb-Mo-Si, Nb-W-Si, Ta-Mo-Si, Ta-W-Si, and the like. Though generally it is undesirable to utilize refractory oxides or materials in the formation of the dopant carriers of this invention, because of the possibility of the transmittal of undesirable impurities during the doping process, in certain circumstances the use of oxides may be warranted. For example, on occasion it may be desirable to form the carrier from an oxide of the dopant impurity itself, utilizing the materials of copending application U.S. Ser. No. 502,262, filed June 8, 1983, such that heating of the dopant oxide carrier will release controllable quantities of the dopant impurity. The arsenic oxide containing compounds of the above-identified copending application are particulaly suited for such circumstance.

In the utilization of an infiltrated composite system, any of the aforedescribed impregnating materials, having melting points within the range of about 1200° C. to about 2700° C., can also be utilized as infiltrating materials providing they are used in combination with an impregnating material having a higher melting point. In addition to the aforesaid, however, the infiltrating material can be a compound, mixture or pure element of silicon, cobalt, mangenese, nickel and the like.

After formation of the solid dopant carrier, it must be impregnated with one or more appropriate dopants and/or other additives for utilization therewith. Any suitable means of impregnation can be utilized with the carrier of this invention including applying molten dopant, powdered dopant, solutions, suspensions, sputtering, molecular beam, vapors and the like.

A preferred means involves the heating of the carrier with a solution of suspension of the dopant material in organic or aqueous solvent. Generally, the concentration of the solution or suspension is selected to yield a concentration of dopant on the carrier of at least about 10% by weight. After treatment of the carrier with a dopant solution or suspension, the carrier is typically dried by heating.

Multiple dopants can be utilized with the solid carrier of the invention. Typical dopants include compounds containing the elements phosphorus, arsenic, antimony, boron, gallium, aluminum, zinc, tin, silicon, tellurium, cadmium, and the like. Dopant compounds include $AlAsO_4$, $YaSo_4$, $Mg_6As_2O_{11}$, $Mg_3As_2O_8$, $Ca_6As_2O_{11}$, $Ca_3As_2O_8$, $Ba_6As_2O_{11}$, $Ba_2As_2O_8$, $Sr_6As_2O_{11}$ and $Sr_3As_2O_8$.

The thus formed dopant sources are typically ready for use in the vapor deposition process without any further processing steps being required. Typically, wafers of the dopant source are arranged in trays together with wafers of the semiconductor host substrate to be doped and heated in confining furnaces to temperatures from about 500° C. to about 1400° C. until appropriate quantities of the active dopant impurities have been deposited on the semiconductor host substrate surface.

The following examples are provided to illustrate the invention and are not meant as a limitation thereof. All temperatures are in degrees centigrade unless otherwise indicated.

EXAMPLE 1

Reticulated polyurethane filter foam material formed into a 3 inch diameter wafer of 40 mil thickness having about 100 pores per inch was impregnated with a 30% aqueous alpha SiC slip having a refractory content comprising 65% submicron SiC, 35% 1000 grit SiC. The impregnation was effected by dipping the polyurethane foam wafer into the aqueous composition and removing excess fluids by hand squeezing. The thus impregnated wafer was allowed to dry overnight at room temperature until it had less than about 10% moisture content.

The top surface of the thus impregnated and dried foam wafer was coated with dry powdered (500 micron) metallic silicon to a weight ratio of silicon to impregnated foam material of 0.75:1.00. The coated impregnated wafer was decomposed and silicon infiltrated by heating, in a vacuum furnace, at 1500° C. up to a peak of 1550° C. for 15 minutes. The cooled resulting product comprised a composite of SiC particles in a matrix of silicon, substantially corresponding in porosity and form to the reticulated polyurethane foam. The polyurethane had decomposed.

EXAMPLE 2

A reticulated, 3 inch diameter 50 mil thick, polyurethane foam wafer was impregnated with an alpha SiC slip and air dried in accord with example 1. The top surface of the resulting dried wafer was coated with dry powdered (100 micron) $MoSi_2$ to a weight ratio of $MoSi_2$ to impregnated material of 1.50:1.00. The thus coated impregnated wafer was decomposed and $MoSi_2$ infiltrated by heating at 2200° C., in an Argon atmosphere, for 30 minutes. The cooled resulting product comprised a composite of SiC particles, in a matrix of $MoSi_2$ substantially corresponding in porosity and form to the reticulated polyrethane foam. The polyurethane foam had decomposed.

EXAMPLE 3

A reticulated, 3 inch diameter 50 mil thick, polyurethane foam wafer having a porosity of about 100 pores per inch is impregnated with a 40% aqueous suspension of 1000 grit particulate graphite and air dried in accord with the process of Example 1.

The top surface of the thus-impregnated and dried foam wafer is coated with dry, powdered (500 micron) metallic silicon to a weight ratio of silicon to impregnated material of 2.50:1.00. The coated, impregnated wafer is decomposed and silicon infiltrated by heating, in a vacuum furnace, at 1525° C. for 15 minutes. The resulting product comprises a composite of a continuous SiC phase and a minor discontinuous Si phase substantially corresponding in porosity and form to the reticulated polyurethane foam. The polyurethane foam had decomposed.

EXAMPLE 4

Reticulated polyurethane foam wafers having a porosity of about 100 pores per inch are impregnated with a 40% aqueous suspension of 1000 grit $B_4C$ powder, dried, coated and heated in accord with Example 1.

The resulting product comprises a composite of particulate $B_4C$ in a silicon matrix substantially corresponding in porosity and form to the reticulated polyurethane foam. The polyurethane had decomposed.

EXAMPLE 5

Reticulated polyurethane foam wafers containing approximately 60 pores per inch are impregnated with a 50% aqueous suspension of 1000 grit particulate graphite, hand squeezed and air dried in accord with Example 1. The foam is coated with plus 100 mesh/minus 60 mesh boron in a weight ratio to impregnated foam of 1.0:1.0. The thus impregnated and coated foam is decomposed and boron infiltrated by heating at 2400° C. for 30 minutes, in an Argon atmosphere.

The resulting product comprises a composite of boron carbide and boron substantially corresponding in porosity and form to the reticulated polyurethane foam. The polyurethane had decomposed.

EXAMPLE 6

Reticulated polyurethane foam wafers containing approximately 60 pores per inch are impregnated with a 50% aqueous suspension of 1,000 grit particulate graphite, hand squeezed and air dried in accord with Example 1. The foam is coated with minus 100 mesh titanium in a weight ratio to impregnated foam of 3.0:1.0 The thus impregnated and coated foam is decomposed and titanium infiltrated by heating at 1850° C., for 30 minutes, in an Argon atmosphere.

The resulting product comprises a composite of TiC and titanium, substantially corresponding in porosity and form to the reticulated polyurethane foam. The polyurethane had decomposed.

EXAMPLE 7

Reticulated polyurethane foam wafers containing approximately 100 pores per inch are impregnated with a 60% aqueous suspension of 1,000 grit particulate boron, hand squeezed and air dried in accord with Example 1. The foam is coated with minus 60 mesh metallic silicon in a weight ratio to impregnated foam of 1.0:1.0. The thus impregnated and coated foam is then heated, in a vacuum furnace, at 1650° C. for 30 minutes.

The resulting product comprises a composite of boron silicide (BoSi) and silicon, substantially corresponding in porosity and form to the reticulated polyurethane foam. The polyurethane had decomposed.

EXAMPLE 8

A foamed polyurethane wafer, 3.0 inches in diameter and 0.1 inch in thickness was impregnated by immersion in a silicon slip containing 60 grams metallic silicon, 39 grams deionized water, 0.5 grams of ammonium alginate, 0.3 grams of styrene maleic anhydride copolymer and 0.2 grams of ammonium carboxylate. The impregnated wafer was hand squeezed to remove excess fluids and was measured, showing a diameter of 3.2 inches and a thickness of 0.106 inches. The thus treated wafer was placed on an alumina plate and nitrided, by heating, to a temperature of 1,400° C. in a 4 inch mullite furnace for 1.5 hours, then at 1450° C. for 12 hours in the presence of flowing (2 l/min) gaseous nitrogen atmosphere. The thus formed wafers were formed to be comprised of $Si_3N_4$ and had substantially retained the structural porosity of the foamed polyurethane, though the polyurethane had essentially decomposed. The dimension of the wafers were taken and were found to be an average 3.2 inches in diameter and 0.123 inches thick. The wafers did not show deformation such as bending or warping and had a porous surface.

EXAMPLE 9

Reticulated polyurethane foam wafers, 3 inches in diameter, ⅛ inch thick and containing about 100 pores per inch, are impregnated with a 70% aqueous alpha SiC slip in accord with example 1. The impregnated foam wafer is hand squeezed, to remove excess slurry, and heated in an induction furnace at 2150° C. in an argon atmosphere for 1.0 hours. The resulting formed wafers are found to be comprised of sintered SiC and to have substantially retained the structural porosity and form of the original reticulated polyurethane foam, though the polyurethane is decomposed.

EXAMPLE 10

Reticulated polyurethane foam wafers, 3 inches in diameter, ¼ inch thick and containing about 60 pores per inch are impregnated with a 60% aqueous suspension of 1000 grit particulate $TiB_2$, hand squeezed and air dried in accord with Example 1. The dried, impregnated wafers are then heated in an induction furnace to 1900° C., in an argon atmosphere, for 30 minutes. The resulting formed wafers are found to be comprised of sintered $TiB_2$ and to have substantially retained the structural porosity and form of the original polyurethane foam, though the polyurethane is decomposed.

EXAMPLE 11

Reticulated polyurethane foam wafers, 3 inches in diameter, ¼ inch thick and containing approximately 60 pores per inch are impregnated with a 60% aqueous suspension of 1000 grit particulate composition comprising 70 parts $TiB_2$ and 30 parts AlN. The impregnated wafers are hand squeezed and air dried in accord with Example 1, then heated in an induction furnace at 1830° C., in an argon atmosphere, for 30 minutes. The resulting formed wafers are found to be comprised of sintered $TiB_2$/AlN and to have essentially retained the structural porosity and form of the original polyurethane foam, though the polyurethane is decomposed.

EXAMPLE 12

Composite SiC wafers A-D, prepared in accord with the method of Example 1, were sprayed with an aqueous dopant suspension comprising 60 parts by weight $SiP_2O_7$, 1 part by weight colloidal silica, 1 part by weight sulfonated aliphatic polyester and 38 parts by weight deionized water. The amount of dopant suspension sprayed on was an amount sufficient to effect a 200% weight add-on calculated after drying for 1 hour at 100° C. The dried dopant wafers were then heated at 1000° C., in air for 30 minutes to sinter the dopant containing source wafers.

The aforesaid prepared dopant source wafers were heated in a diffusion furnace with single crystal silicon host substance semiconductor elements for 45 minutes at varying temperatures in a nitrogen atmosphere. The resulting phosphorus doped semiconductor elements were etched with a 10% aqueous hydrofluoric acid solution and tested in accord with ASTM F-43-78 to determine sheet resistivity. ASTM F43-78 defines a four point probe technique for ascertaining the ratio of potential gradient parallel to the current in the material to the current density. The elements were confirmed to have uniform n-type regions and found to have average sheet resistivity as shown in Table I. The used dopant source wafers did not show deformation.

TABLE I

| Wafer | Diffusion Temp. (°C.) | Diffusion Time (Min.) | Average Sheet Resistance (OHMS/square) |
| --- | --- | --- | --- |
| A | 1,000 | 45 | 4.7 |
| B | 950 | 45 | 7.7 |
| C | 900 | 45 | 18.2 |
| D | 850 | 45 | 48.0 |

EXAMPLE 13

Composite SiC wafers, E-H, prepared in accord with the method of Example 1 were sprayed, at room temperature, with an aqueous dopant suspension comprising 100 parts by weight $AlAsO_4$, 122 parts by weight de-ionized water, 1.5 parts by weight ammonium alginate, 1.0 parts by weight of styrene maleic anhydride copolymer and 0.7 parts by weight ammonium carboxylate to a dry weight add-on of 100% calculated after drying at 100° C. for 1 hour. The dried dopant containing wafers were thereafter heated at 1100° C. in air for 1 hour.

Single crystal silicon host substrate semiconductor elements, which were heated at varying temperatures for varying times with the dopant wafers, etched with 10% hydrofluoric acid and tested in accord with ASTM F43-78 were found to have average sheet resistivity as shown in Table II.

TABLE II

| Wafer | Diffusion Temp. (°C.) | Diffusion Time (Hrs.) | Atmosphere | Average Sheet Resistance (ohms/square) |
| --- | --- | --- | --- | --- |
| E | 1000 | 2 | Nitrogen | 78.2 |
| F | 1000 | 6 | Nitrogen: 99.95% Oxygen: 0.05% | 23.96 |
| G | 1025 | 6 | Nitrogen | 7.0 |
| H | 1025 | 1 | Nitrogen | 37.8 |

EXAMPLE 14

100 grams of $AlAsO_4$, having an average particle size of 50 microns, 122 milliliters of de-ionized wafer, 1.5 grams of ammonium alginate, 1.0 grams of styrene maleic anhydride copolymer and 0.7 gramms of ammonium carboxylate were intimately mixed and milled, at room temperature, on a laboratory ball mill for 2 hours to form an intimately mixed slurry. A 3 inch diameter silicon carbide foam wafer, formed by impregnating a 3 inch diameter, 60 mil thick reticulated polyurethane foam, having from about 10 to about 100 pores per inch, with a 70% aqueous SiC slurry, dried infiltrated with powdered (500 micron) metallic silicon and thereafter fired at 1550° C. for 15 minutes in accord with Example 1, was impregnated with the aforesaid slurry by immersion and vacuum filtration through the wafer. The thus impregnated wafer was fired in a kiln, in an oxygen atmosphere, at 950° C. for 3 hours. The oxygen atmosphere assured the decomposition of binder components. The aforesaid prepared dopant source wafer was heated in a diffusion oven with a single crystal silicon host substrate semiconductor element for 6 hours at 1000° C. in a nitrogen atmosphere. The resultant arsenic doped semiconductor element was etched with a 10% aqueous hydrofluoric acid solution and tested in accord with ASTM F43-78 to determine sheet resistivity. ASTM F43-78 defines 4 point probe technique for ascertaining the ratio of potential parallel to the current in the material to the current density. The element was confirmed to have a uniform n-type region and found to have a sheet resistivity of 40 ohms/square. The used arsenate containing dopant wafer did not show deformation such as bending or growing and retained its smooth porous surface.

In a similar manner, $YAs_2O_4$ dopant wafers are produced which do not show deformation such as bending or growing when utilized to dope semiconductor elements in a diffusion furnace.

We claim:

1. A dopant source comprising a dopant carrier comprising heat-bonded particulated refractory material interconnectingly arranged in an open cellular foam wherein the refractory material is selected from at least one of $AlAsO_4$, $YAsO_4$, $Mg_6As_2O_{11}$, $Mg_3As_2O_8$, $Ca_6As_2O_{11}$, $Ca_3As_2O_8$, $Ba_6As_2O_{11}$, $Ba_3As_2O_8$, $Sr_6As_2O_{11}$ and $Sr_3As_2O_8$.

2. A dopant source consisting essentially of:
   a. A rigid carrier resistant to structural deformation at a temperature between 500° C. and 1400° C. consisting essentially of a wafer of heat-bonded particulated non-oxide refractory material interconnectingly arranged in an open cellular foam, said refractory material selected from the group consisting of tungsten, tantalum, molybdenum, niobium, chromium, zirconium, vanadium, titanium, boron, carbon, tungsten/tantalum binary alloys, tungsten/niobium binary alloys, tungsten/molybdenum binary alloys, tungsten/chromium binary alloys, molybdenum/chromium binary alloys, molybdenum/titanium binary alloys, molybdenum/zirconium binary alloys, $AlB_{12}$, $Ti_2B$, $TiB_2$, $ZrB_2$, $HfB_2$, $Nb_3B_2$, $NbB$, $Nb_3B_4$, $NbB_2$, $Ta_2B$, $TaB$, $TaB_4$, $TaB_2$, $Cr_2B$, $Cr_5B_3$, $CrB$, $Cr_3B_4$, $CrB_2$, $CrB_4$, $Mo_2B$, $Mo_3B_2$, $MoB$, $MoB_2$, $MoB_5$, $MoB_{12}$, $W_2B$, $WB$, $W_2B_5$, $WB_{12}$, $Mn_4B$, $Mn_2B$, $MnB$, $Mn_3B_4$, $MnB_2$, $MnB_4$, $Ni_4B_3$, NIB, NbC, $Nb_2C$, TiC, ZnC, HfC, $V_2C$, VC, $Ta_2C$, TaC, $Cr_{23}C_6$, $Cr_7C_3$, $Cr_3C_2$, $Mo_2C$, MoC, $W_2C$, WC, $Fe_3C$, $B_4C$, $B_{13}C_2$, SiC, $Si_3N_4$, TiN, ZiN, HfN, VN, NbN, TaN, AlN, BN, NbP, $Ti_3P$, $Ti_2P$, $Cr_3P$, BP, $CoP_2$, $Ti_5Si_3$, $Ti_5Si_4$, TiSi, $TiSi_2$, $Zr_4Si$, $Zr_2Si$, $Zr_5Si_3$, $Zr_4Si_3$, $Zr_6Si_5$, ZrSi, $ZrSi_2$, $Hf_2Si$, $Hf_5Si_3$, $Hf_3Si_3$, HfSi, $HfSi_2$, $MoSi_2$, $V_3Si$, $V_5Si_3$, $V_5Si_4$, $VSi_2$, $Nb_4Si$, $Nb_5Si_3$, $NbSi_2$, $Ta_9Si_2$, $Ta_2Si_3$, $Ta_5Si$, $TaSi_2$, Ti-Zr-C ternary alloys, Ti-Hf-C ternary alloys, Ti-V-C ternary alloys, Ti-Nb-C ternary alloys, Ti-Ta-C ternary alloys, Ti-Mo-B ternary alloys, Zr-Hf-B ternary alloys, Zr-Ta-B ternary alloys, Hf-Ta-B ternary alloys, V-Nb-B ternary alloys, Nb-Ta-Si ternary alloys, Nb-Mo-Si ternary alloys, Nb-W-Si ternary alloys, Ta-Mo-Si ternary alloys and Ta-W-Si ternary alloys; and
   b. A dopant compound selected from at least one of $AlAsO_4$, $YAsO_4$, $Mg_6As_2O_{11}$, $Mg_3As_2O_8$, $Ca_6As_2O_{11}$, $Ca_3As_2O_8$, $Ba_6As_2O_{11}$, $Ba_3As_2O_8$, $Sr_6As_2O_{11}$ and $Sr_3As_2O_8$.

* * * * *